(12) United States Patent
Song

(10) Patent No.: US 10,790,227 B2
(45) Date of Patent: Sep. 29, 2020

(54) SEMICONDUCTOR DEVICE WITH INTERCONNECT STRUCTURE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Xing Hua Song, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/292,889

(22) Filed: Mar. 5, 2019

(65) Prior Publication Data

US 2019/0273043 A1 Sep. 5, 2019

(30) Foreign Application Priority Data

Mar. 5, 2018 (CN) .......................... 2018 1 0179077

(51) Int. Cl.
*H01L 23/12* (2006.01)
*H01L 23/48* (2006.01)
(Continued)

(52) U.S. Cl.
CPC .... *H01L 23/5226* (2013.01); *H01L 21/31144* (2013.01); *H01L 21/3212* (2013.01);
(Continued)

(58) Field of Classification Search
CPC .......... H01L 23/5226; H01L 21/31144; H01L 21/3212; H01L 21/32134; H01L 21/7684;
(Continued)

(56) References Cited

U.S. PATENT DOCUMENTS 8,264,083 B2 * 9/2012 Nawata ............. H01L 21/76802
257/211
9,653,399 B2 * 5/2017 Zhu .................. H01L 21/823821
(Continued)

*Primary Examiner* — Alonzo Chambliss
(74) *Attorney, Agent, or Firm* — Anova Law Group, PLLC

(57) ABSTRACT

Semiconductor structures and fabrication methods are provided. An exemplary fabrication method includes providing a semiconductor substrate; forming a first dielectric layer having a first region and a second regions at each of two sides of the first region on the semiconductor substrate; forming a first opening in the first region of the first dielectric layer and a second opening in each of the second regions of the first dielectric layer; forming a first interconnect member in the first opening; forming a second interconnect member with a top surface lower than a top surface of the first dielectric layer in each of the second openings; forming a second dielectric layer having a third opening with a bottom exposing a top surface of the first interconnect member on surfaces of the first interconnect member, second interconnect members and the first dielectric layer; and forming an interconnect structure in the third opening.

20 Claims, 4 Drawing Sheets

(51) Int. Cl.
  *H01L 21/4763*  (2006.01)
  *H01L 23/522*  (2006.01)
  *H01L 23/532*  (2006.01)
  *H01L 21/768*  (2006.01)
  *H01L 21/311*  (2006.01)
  *H01L 21/3213*  (2006.01)
  *H01L 21/321*  (2006.01)

(52) U.S. Cl.
  CPC .... *H01L 21/32134* (2013.01); *H01L 21/7684* (2013.01); *H01L 21/76807* (2013.01); *H01L 21/76877* (2013.01); *H01L 23/481* (2013.01); *H01L 23/53214* (2013.01); *H01L 23/53228* (2013.01)

(58) Field of Classification Search
  CPC ......... H01L 21/76877; H01L 23/53214; H01L 23/53228; H01L 23/481
  See application file for complete search history.

(56) References Cited

U.S. PATENT DOCUMENTS

2004/0140564 A1* 7/2004 Lee ................... H01L 23/53238
                 257/758
2013/0134590 A1* 5/2013 Nogami ............. H01L 23/5222
                 257/741
2016/0240485 A1* 8/2016 Zhu ................... H01L 23/53295

* cited by examiner

SEMICONDUCTOR DEVICE WITH INTERCONNECT STRUCTURE AND FABRICATION METHOD THEREOF

CROSS-REFERENCES TO RELATED APPLICATIONS

This application claims the priority of Chinese patent application No. 201810179077.8, filed on Mar. 5, 2018, the entirety of which is incorporated herein by reference.

FIELD OF THE DISCLOSURE

The present disclosure generally relates to the field of semiconductor manufacturing and, more particularly, relates to semiconductor structures and fabrication methods.

BACKGROUND

With the rapid development of semiconductor manufacturing technologies, semiconductor devices have been developed into the deep sub-micrometer structure regime. Because the number of the semiconductor devices in an integrated circuit (IC) chip has been continuously increased, the size of the semiconductor devices has been continuously reduced with increased integration level. The high performance and high density interconnections of the semiconductor devices are not only achieved in a single interconnect layer, but also in multiple layers. In a multiple-layer interconnect structure, a plurality of interconnect layers are stacked together and interlayer dielectric layers are formed between interconnect layers to connect semiconductor devices. For the multiple-layer interconnect structures formed by the dual-damascene process, trenches and vias are formed in the interlayer dielectric layers first, and then a conductive material is used to fill the trenches and the vias. The dual-damascene process is able to avoid the overlay error and solve the metal process limitation, and the multiple-layer interconnect structures formed by the dual damascene process are widely used in the semiconductor manufacturing process to improve the reliability of the devices. Thus, the multiple-layer interconnect structures has become the mainstream of the metal interconnect technology.

However, the multilayer interconnect structures may be easy to have a leakage current issue. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a semiconductor substrate; forming a first dielectric layer on the semiconductor substrate, a first dielectric layer on the semiconductor substrate, the first dielectric layer having a first region and second regions each at a side of the first region; forming a first opening in the first region of the first dielectric layer and a second opening in each of the second regions of the first dielectric layer; forming a first interconnect member in the first opening; forming a second interconnect member with a top surface lower than a top surface of the first dielectric layer in each of the second openings; forming a second dielectric layer having a third opening with a bottom exposing a top surface of the first interconnect member on surfaces of the first interconnect member, the second interconnect members and the first dielectric layer; and forming an interconnect structure in the third opening.

Another aspect of the present disclosure includes a semiconductor structure. The semiconductor structure includes a semiconductor substrate; a first dielectric layer on the semiconductor substrate a first dielectric layer on the semiconductor substrate, the first dielectric layer having a first region and second regions each at a side of the first region; and a first interconnect member formed in the first region of the first dielectric layer and a second interconnect member formed in each of the second regions of the first dielectric layers. A top surface of the second interconnect member is lower than a top surface of the first dielectric layer. The semiconductor structure also includes a second dielectric layer formed on the first interconnect member, the second interconnect member and the top surface of the first dielectric layer; and an interconnect structure electrically connected to the first interconnect member and formed in the second dielectric layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
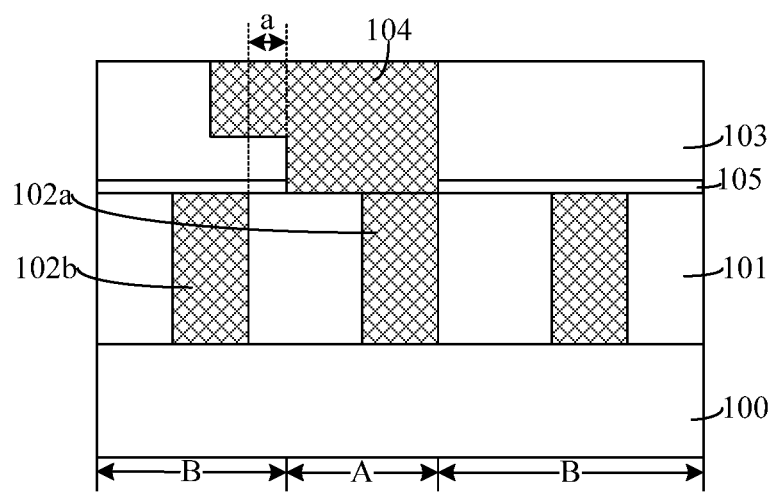
FIG. 1 illustrates a semiconductor structure.

FIG. 1 illustrates a semiconductor structure. As shown in FIG. 1, the semiconductor structure includes a semiconductor substrate 100 and a first dielectric layer 101 on the semiconductor substrate 100. The first dielectric layer 101 includes a first region A and two second regions B at two sides of the first region A. A first interconnect member 102a is formed in the first region A of the first dielectric layer 101; and a second interconnect member 102b is formed in the second region B of the first dielectric layer 101. Further, the semiconductor structure includes a stop layer 105 formed on the first dielectric layer 101, the first interconnect member 102a and the second interconnect members 102b; and a second dielectric layer 103 formed on the stop layer 105. An interconnect structure 104 is formed in the second dielectric layer 103 and the stop layer 105 and on the first interconnect member 102a.

The interconnect structure 104 is electrically connected to the first interconnect member 102a. The process for forming the interconnect structure 104 includes removing a portion of the second dielectric layer 103 until the top surface of the stop layer 105 is exposed to form an initial opening; removing the portion of the of the stop layer 105 under the bottom of the initial opening to form an opening; and forming the interconnect structure 104 in the opening. The initial opening includes a trench and an initial through hole on the bottom of the trench. The bottom of the initial through hole exposes the stop layer 105. The portion of the stop layer 105 under the bottom of the initial through hole is subsequently removed to form a through hole. In particular, the interconnect structure 104 in the through hole is electrically connected with the first interconnect member 102a.

However, if the size of the initial through hole along the direction parallel to the surface of the semiconductor substrate 100 is too small, the portion of the stop layer 105 under the initial through hole may be difficult to completely remove. Thus, it may be difficult to connect the interconnect structure 104 to the first interconnect member 102a. One approach to improve the electrical connection between the interconnect structure 104 and the first interconnect member 102a is to increase the size of the initial through hole along the direction parallel to the surface of the semiconductor substrate 100. In particular, the size of the through hole along the direction parallel to the surface of the semiconductor substrate 100 is substantially large. However, with the increase of the integration level of the semiconductor devices, the distance between the first interconnect member 102a and the second interconnect member 102b has been continuously reduced. If the size of the through hole along the direction parallel to the surface of the semiconductor substrate 100 is substantially large, when the interconnect structure 104 formed in the through hole is electrically connected to the first interconnect member 102a, the distance between the interconnect structure 104 and the second interconnect member 102b is substantially small. Accordingly, a break-down issue is easy to occur in the first dielectric layer 101 between the interconnect structure 104 and the second interconnect member 102b; and a leakage current issue may occur between the interconnect connect structure 104 and the second interconnect member 102b. Thus, the performance of the semiconductor structure is adversely affected.

The present disclosure provides a semiconductor structure and a method for fabricating a semiconductor structure. The semiconductor structure may include a semiconductor substrate; and a first dielectric layer formed on the semiconductor substrate. The first dielectric layer may include a first region and two second regions at two sides of the first region. A first opening may be formed in the first region of the first dielectric layer; and a second opening may be formed in each of the second regions. A first interconnect member may be formed in the first opening; and a second interconnect member may be formed in the second opening. The top surface of the second interconnect member may be lower than the top surface of the first dielectric layer. Further, a second dielectric layer may be formed on the surfaces of the first interconnect member, the second interconnect members and the first dielectric layer. A third opening may be formed in the second dielectric layer; and the third opening may expose the top surface of the first interconnect member. The semiconductor structure may has a desired performance.

Figure 8:
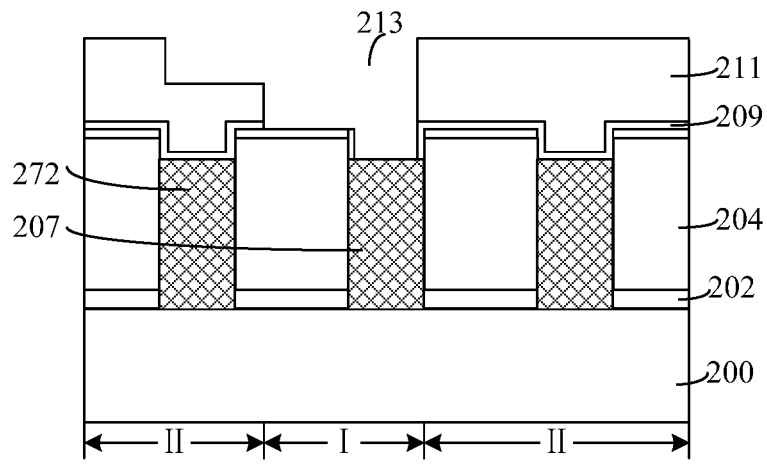
Figure 9:
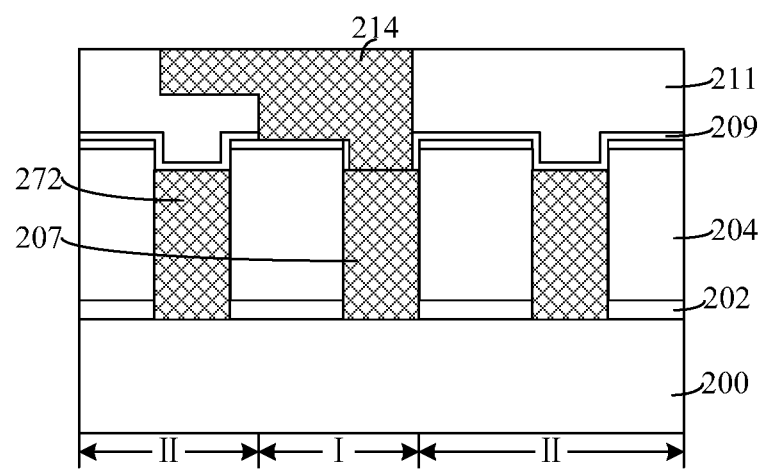
Figure 10:
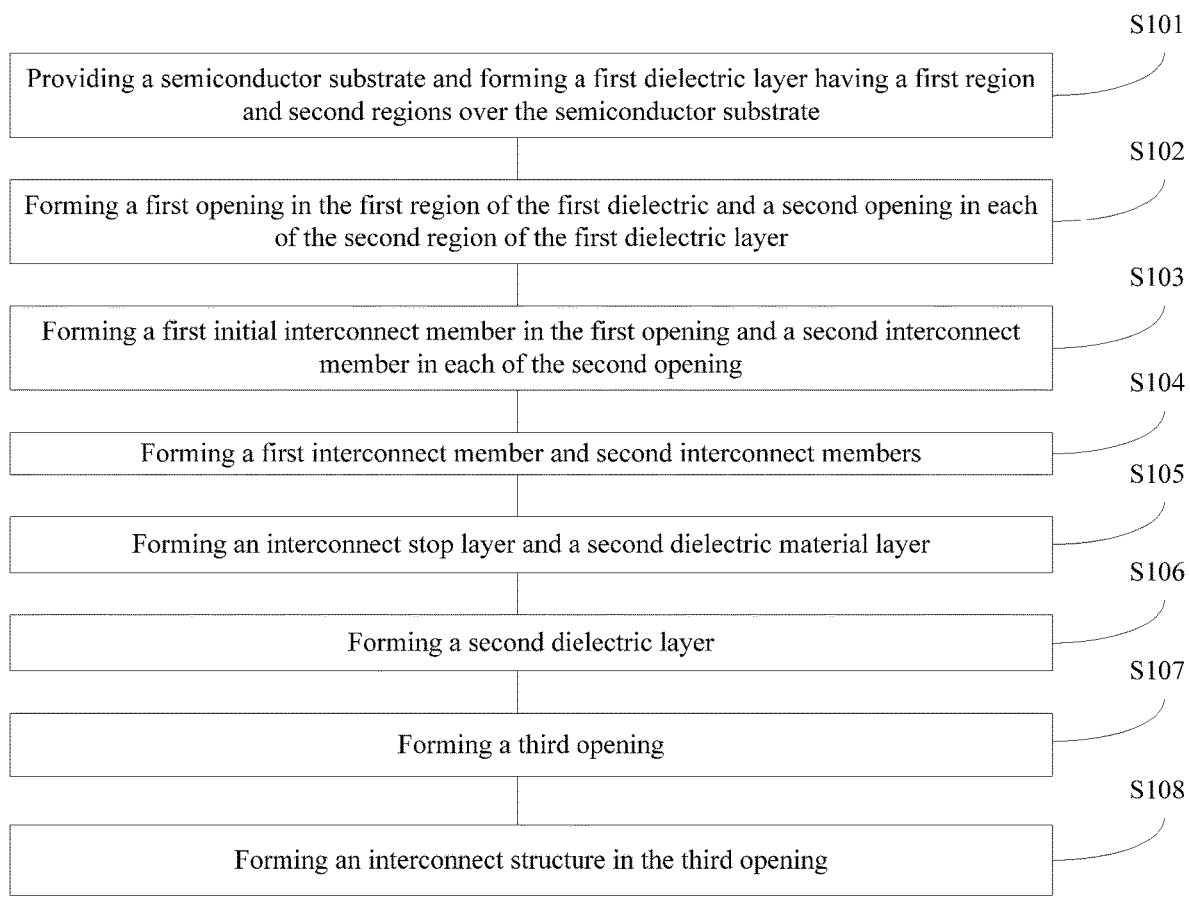
FIG. 10 illustrates an exemplary fabrication process of a semiconductor structure consistent with various disclosed embodiments.

FIG. 10 illustrates an exemplary fabrication process of a semiconductor structure consistent with various disclosed embodiments. FIGS. 2-9 illustrate structures corresponding to certain stages during the exemplary fabrication process.

Figure 2:
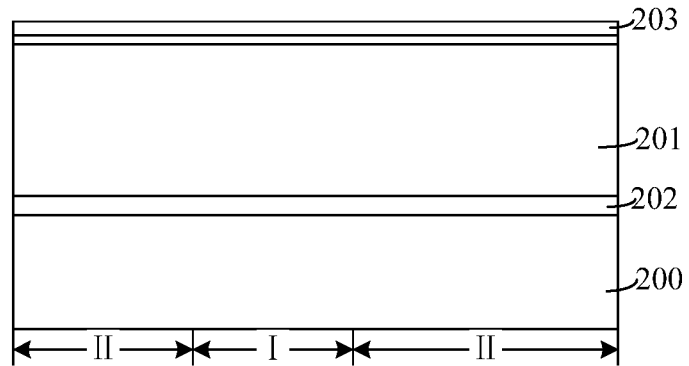
FIGS. 2-9 illustrate structures corresponding to certain stages during an exemplary fabrication process of a semiconductor structure consistent with various disclosed embodiments.

As shown in FIG. 10, at the beginning of the fabrication process, a semiconductor substrate with certain structures is provided (S101). FIG. 2 illustrates an exemplary, corresponding semiconductor structure.

As shown in FIG. 2, a semiconductor substrate 200 is provided. A first dielectric material layer 201 may be formed on a surface of the semiconductor substrate 200. The first dielectric material layer 201 may have a first region I and a second region II at each of the sides of the first region I.

In one embodiment, the semiconductor substrate 200 is made of silicon. In some embodiments, the semiconductor substrate may be a germanium substrate, a silicon germanium substrate, a silicon on insulator (SOI) substrate, a germanium on insulator (GOI) substrate, or a silicon germanium on insulator substrate, etc.

In some embodiments, semiconductor devices, such as MOS transistors, etc., may be formed in/on the semiconductor substrate 200.

The first dielectric material layer 201 may be made of any appropriate material. In one embodiment, the first dielectric material layer 201 is made of a low-K dielectric material. The low-K dielectric material refers to a dielectric material with a relative dielectric constant smaller than 3.9. The low-K dielectric material may be a porous material.

In one embodiment, the first dielectric material layer 201 is made of SiCOH. In some embodiments, the first dielectric layer may be made of fluoride-doped silicon oxide (FSC), boron doped silicon dioxide (BSG), phosphor doped silicon dioxide (PSG), or boron and phosphor co-doped silicon dioxide (BPSG), etc.

Various processes may be used to form the first dielectric material layer 201, such as a chemical vapor deposition (CVD) process, or a physical vapor deposition (PVD) process, etc.

Interconnect wirings may be subsequently formed in the first material dielectric layer 201. The first dielectric material layer 201 may be made of a low-K dielectric material. The low-K dielectric material may reduce the capacitance among the interconnect wrings. Thus, it may be able to reduce the time constant of the interconnect wirings in the interconnect structure; and the time delay of the signal lines may be reduced.

The first region I may be used to subsequently form a first opening. The second regions II may be used to subsequently form second openings.

In one embodiment, as shown in FIG. 2, a first stop layer 202 may be formed between the first dielectric material layer 201 and the semiconductor substrate 200. The first stop layer 202 may be used as a stop layer for subsequently forming the first opening and the second openings.

The first stop layer 202 may be made of any appropriate material. In one embodiment, the first stop layer 202 is made of silicon nitride. Various processes may be used to form the first stop layer 202, such as a CVD process, or a PVD process, etc.

Further, as shown in FIG. 2, a first mask layer 203 may be formed on the surface of the first dielectric material layer 201. The first mask layer 203 may expose portions of the top surfaces of the first region I of the first dielectric material layer 201 and the second regions II of the first dielectric material layer 201. The first mask layer 203 may be used as a mask layer for subsequently forming a first dielectric layer.

The first mask layer 203 may be made of any appropriate material, such as silicon nitride, or titanium nitride, etc.

In one embodiment, a first transitional layer (not labeled) may be formed between the first dielectric material layer 201 and the first mask layer 203. The first transitional layer may improve the interfacial status between the first dielectric material layer 201 and the first mask layer 203. The first transitional layer may be made of any appropriate material, such as silicon oxide, etc.

Figure 3:
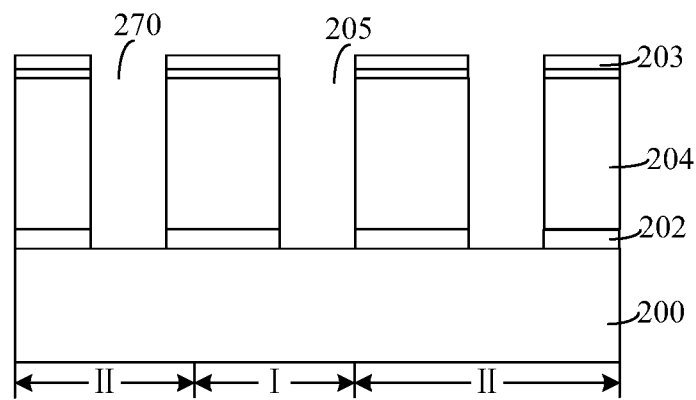

Returning to FIG. 10, after forming the first mask layer, a first opening and second openings may be formed (S102). FIG. 3 illustrates a corresponding semiconductor structure.

As shown FIG. 3, a first opening 205 is formed in the first region I of the first dielectric material layer 201 and in the first stop layer 202; and second openings 270 may be formed in the second regions II of the first dielectric material layer 201 and the first stop layer 202. After forming the first opening 205 and the second openings 270, the first dielectric material layer 201 may be configured as a first dielectric layer 204.

The process for forming the first opening 205 and the second openings 270 may include etching the first dielectric material layer 201 and the first transitional layer using the first mask layer 203 as an etching mask until the first stop layer 202 is exposed to form the first dielectric layer 204 having a first initial opening (not labeled) in the first region I of the first dielectric material layer 201 and second initial openings (not labeled) in the second region II of the first dielectric material layer 201; and removing a portion of the first stop layer 202 under the bottom of the first initial opening to form the first opening 205 and portions of the first stop layer 202 under the second initial openings to form the second openings 270. In particular, one second opening 270 may be formed in one second region II of the first dielectric layer 204.

The process for etching the first dielectric material layer 201 and the first transitional layer may include a dry etching process, a wet etching process, a combination of a dry etching process and a wet etching process, etc.

The first dielectric layer 204 may be made of any appropriate material, such as silicon oxide, or silicon oxynitride, etc. The first dielectric layer 204 may be used to electrically isolate the subsequently formed first interconnect member and second interconnect members.

The first initial opening may be used to form the first opening 205. The second initial openings may be used to form the second openings 270.

The process for removing the portion of the first stop layer 202 under the first initial opening may be a dry etching process, a wet etching process, or a combination of a dry etching process and a wet etching process.

The process for removing the portions of the first stop layer 202 under the second initial openings may be a dry etching process, a wet etching process, or a combination of a dry etching process and a wet etching process.

The first opening 205 may be used to subsequently host a first interconnect member. In particular, the first interconnect member may be subsequently formed in the first opening 205. The second openings 270 may be used to subsequently host second interconnect members. In particular, one second interconnect members may be subsequently formed in each of the second openings 270.

The size of the first opening 205 along a direction parallel to the surface of the semiconductor substrate 200 may be smaller than approximately 32 nm. Along the direction parallel to the surface of the semiconductor substrate 200, the first opening 205 may determine the size of the first interconnect member subsequently formed in the first opening 205.

Portions of the first dielectric layer 204 may be located between the first opening 205 and the second openings 270. The minimum distance between the sidewall surface of the first opening 205 and the sidewall surface of the second opening 270 may be smaller than approximately 32 nm.

Figure 4:
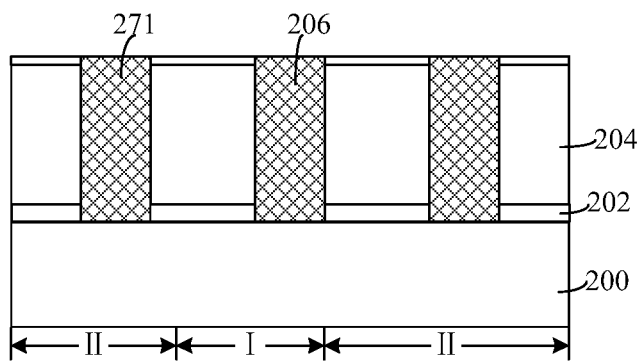

Returning to FIG. 10, after forming the first opening and the second openings, an first initial interconnect member and second initial interconnect members may be formed (S103). FIG. 4 illustrates a corresponding semiconductor structure.

As shown in FIG. 4, a first initial interconnect member 206 is formed in the first opening 205 (referring to FIG. 3); and a second initial interconnect member 271 is formed in each of the second openings 270 (Referring to FIG. 3). The first initial interconnect member 206 and the second initial interconnect members 271 may be formed by forming a first interconnect material layer in the first opening 205 and the second openings 270 and on the first mask layer 203 (referring to FIG. 3); and planarizing the first interconnect material layer until the first transitional layer is exposed.

The first interconnect material layer may be made of a metal material. In one embodiment, the first interconnect material layer is made of Cu. Correspondingly, the first initial interconnect member 206 and the second initial interconnect members 271 may be made of Cu. In some embodiments, the first interconnect material layer may be made of Al. Correspondingly, the first initial interconnect member and the second initial interconnect members may be made of Al.

The first interconnect material layer may be planarized by any appropriate process, such as a chemical mechanical polishing (CMP) process, etc. When planarizing the first interconnect material layer, the first mask layer 203 on the surface of the first dielectric layer 204 may be removed.

The second initial interconnect members 271 may be used to subsequently form second interconnect members.

In one embodiment, the first initial interconnect member 206 may be used to subsequently form a first interconnect member. In some embodiments, the first initial interconnect member may not be subsequently removed. The first initial interconnect member may be configured as the first interconnect member.

The size of the first interconnect member 206 along the direction parallel to the surface of the semiconductor substrate 200 may be smaller than approximately 32 nm. The distance between the first initial interconnect member 206 and the second initial interconnect member 271 may be smaller than 32 nm.

Figure 5:
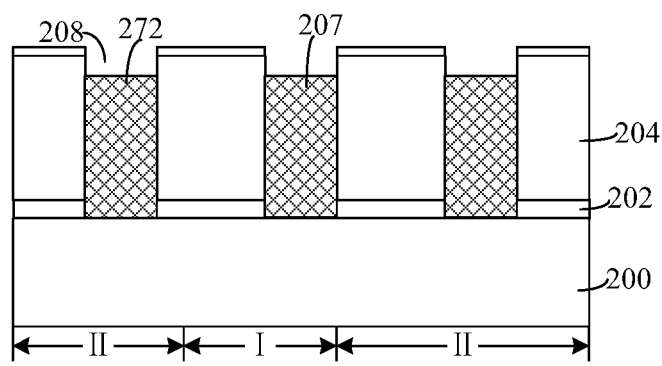

Returning to FIG. 10, after forming the first initial interconnect member and the second initial interconnect members, a first interconnect member and second interconnect members may be formed (S104). FIG. 5 illustrates a corresponding semiconductor structure.

As shown in FIG. 5, a first interconnect member 207 and second interconnect members 272 may be formed. The first interconnect member 207 may be formed by removing a portion of the first initial interconnect member 206. The top surface of the first interconnect member 207 may be lower than the top surface of the first dielectric layer 204. The second interconnect members 272 may be formed by removing top portions of the second initial interconnect members 272. The top surfaces of the second interconnect members 272 may be lower than the top surfaces of the first dielectric layer 204.

In some embodiments, the portion of the first initial interconnect member may not be removed. The first initial interconnect member may be configured as the first interconnect member.

Various processes may be used to remove the portion of the first initial interconnect member 206. In one embodiment, a wet etching process is used to remove the portion of the first initial interconnect member 206 to form the first interconnect member 207. The etching solution of the wet etching process may include hydrogen peroxide and a diluted hydrogen fluoride solution. In some embodiments, the portion of the first initial interconnect member may be removed by a dry etching process, or a combination of a dry etching process and a wet etching process.

Various processes may be used to remove the portions of the second initial interconnect members 271. In one embodiment, a wet etching process is used to remove the portions of the second initial interconnect members 271 to form the second interconnect members 272. The etching solution of the wet etching process may include hydrogen peroxide and diluted hydrogen fluoride solution. In some embodiments, the portions of the second initial interconnect members may be removed by a dry etching process, or a combination of a dry etching process and a wet etching process.

During the process for removing the portion of the first initial interconnect member 206 and the portions of the second initial interconnect members 271, the first transitional layer may protect the surface of the first dielectric layer 204.

The distance between the top surface of the second interconnect member 271 and the top surface of the first dielectric layer 204 may be in a range of approximately 10 nm-50 nm along a direction perpendicular to the top surface of the second interconnect structure. If the distance between the top surface of the second interconnect member 271 and the top surface of the first dielectric layer 204 is smaller than 10 nm, to prevent the portion of the first dielectric layer 204 between the subsequently formed interconnect structure and the second interconnect member 272 from being broken-down, the size of the subsequently formed through-hole for hosting the interconnect structure along the direction parallel to the surface of the semiconductor substrate 200 may be substantially small. Thus, during the process for forming the through hole, the stop layer under the bottom of the through hole may be difficult to etch through. Accordingly, it may be difficult for the interconnect structure in the through hole to have an electrical connection with the first interconnect member 207. If the distance between the top surface of the second interconnect member 271 and the top surface of the first dielectric layer 204 is greater than 50 nm, the removed amount of the second interconnect structure 217 may be substantially large. Accordingly, the height of the second interconnect member 272 may be substantially small; and it may not facilitate to improve the performance of the semiconductor structure.

In one embodiment, the first transitional layer may be formed on the surface of the first dielectric layer 204. Thus, the factors effecting the distance between the top surface of the second interconnect member 271 and the top surface of the first dielectric layer 204 may include the thickness of the first transitional layer and the removed amount of the second initial interconnect member 271. In some embodiments, the first transitional layer may be omitted. Thus, the factors effecting the distance between the top surface of the second interconnect member and the top surface of the first dielectric layer may include the removed amount of the second initial interconnect member.

The size of the first interconnect member 207 along the direction parallel to the surface of the semiconductor substrate 200 may be smaller than 32 nm. In particular, the size of the first interconnect member along the direction parallel to the surface of the semiconductor substrate 200 may be substantially small. Thus, it may be difficult to subsequently remove the portion of the subsequently formed interconnect stop layer on the top surface of the first interconnect member 207. To reduce the difficulty for subsequently removing the portion of the subsequently formed interconnect stop layer on the top surface of the first interconnect member 207, the size of the subsequently formed through hole along the direction parallel to the surface of the semiconductor substrate 200 may be increased. Although the minimum distance between the sidewall surface of the interconnect structure subsequently formed on the top surface of the first interconnect member and the sidewall surface of the second interconnect member 272 along the direction parallel to the surface of the semiconductor substrate 200 is substantially small, because the top surface of the second interconnect member 272 may be lower than the top surface of the first dielectric layer 204, the interconnect structure may have a certain distance between the top surface of the of the first dielectric layer 204 and the second interconnect member 272. Thus, the distance between the interconnect structure and the second interconnect structure 272 may be still sufficiently large. Accordingly, the portion of the first dielectric layer 204 between the interconnect structure and the second interconnect member 272 may not be easily broken-down. Thus, it may not be easy to have a leakage current between the interconnect structure and the second interconnect member 272; and the performance of the semiconductor device may be improved.

Figure 6:
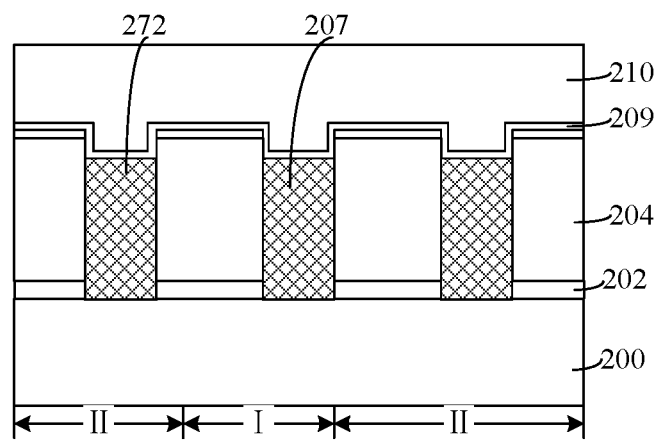

Returning to FIG. 10, after forming the first interconnect member and the second interconnect members, an interconnect stop layer and a second dielectric material layer may be formed (S105). FIG. 6 illustrates a corresponding semiconductor structure.

As shown in FIG. 6, an interconnect stop layer 209 is formed on the first interconnect member 207, the second interconnect members 272 and the first dielectric layer 204; and a second dielectric material layer 210 may be formed on the interconnect stop layer 209.

The interconnect stop layer 209 may be made of any appropriate material. In one embodiment, the interconnect stop layer 209 is made of aluminum oxide.

The second dielectric material layer 210 may be made of any appropriate material. In one embodiment, the second dielectric material layer 210 is made of a low-K dielectric material. The low-K dielectric material refers to a dielectric material with a relative dielectric constant smaller than 3.9. The low-K dielectric material may be a porous material.

In one embodiment, the second dielectric material layer 210 is made of SiCOH. In some embodiments, the second dielectric material layer may be made of fluoride-doped silicon oxide (F SC), boron doped silicon dioxide (BSG), phosphor doped silicon dioxide (PSG), or boron and phosphor co-doped silicon dioxide (BPSG), etc.

In one embodiment, the interconnect stop layer 209 and the second dielectric material layer 210 may be made of different materials. Thus, the interconnect stop layer 209 and the second dielectric material layer 210 may have a substantially high etching selectivity ratio. Accordingly, when subsequently forming a through hole, the interconnect stop layer 209 may prevent the first interconnect member 207 and the second interconnect members 272 from being removed; and the performance of the first interconnect member 207 and the second interconnect members 272 may be improved.

Various processes may be used to form the second dielectric material layer 210, such as a CVD process, or a PVD process, etc.

Interconnect wirings may be subsequently formed in the second dielectric material layer 210. The second dielectric material layer may be made of the low-K dielectric material. The low-K dielectric material may be able to reduce the capacitance among the interconnect wirings; reduce the time constant of the interconnect wirings of the interconnect structure; and reduce the delay of the electrical signals.

A mask structure (not shown) may be formed on the surface of the second dielectric material layer 210. The mask structure may be made of any appropriate material, such as silicon nitride, or titanium nitride, etc. The mask structure may be used as a mask for subsequently etching the second dielectric material layer 210 to form a second dielectric layer. The second dielectric layer may have an opening.

In one embodiment, a second transitional layer may be formed between the mask structure and the second dielectric material layer 210. The second transitional layer may be made of silicon oxide, etc. The second transitional layer may improve the interfacial status between the mask structure and the second dielectric material layer 210.

Figure 7:
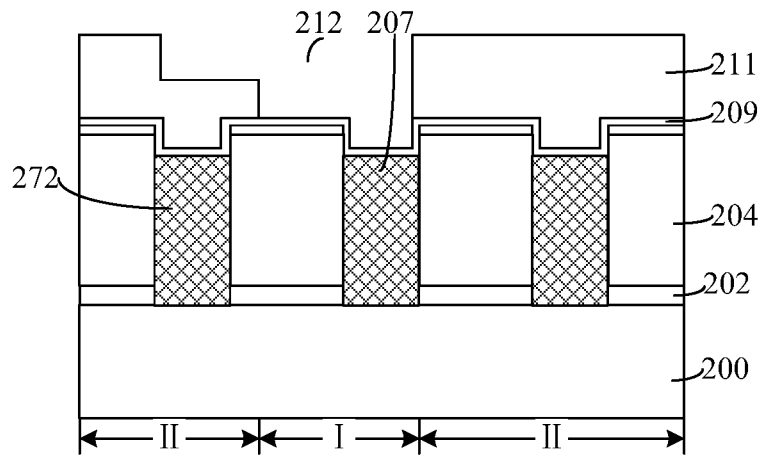

Returning to FIG. 10, after forming the second dielectric material layer, a second dielectric layer may be formed (S106). FIG. 7 illustrates a corresponding semiconductor structure.

As shown in FIG. 7, a second dielectric layer 211 may be formed. The second dielectric layer 211 may have a third initial opening 212. The third initial opening 212 may include a trench (not labeled) and an initial through hole under the bottom of the trench. In one embodiment, the initial through hole may be formed after forming the trench. In some embodiments, the initial through hole may be formed before forming the trench.

In one embodiment, the process for forming the second dielectric layer 211, the through hole and the trench may include forming a first mask layer (not shown) exposing a portion of the surface of the second dielectric material layer 210 on the second dielectric material layer 210; etching the exposed portion of the second dielectric material layer 210 using the first mask layer as an etching mask to form the trench; forming a second mask layer exposing a portion of the second dielectric material layer 210 under the bottom of the trench on the surface of the second dielectric material layer and a portion of the bottom of the trench; and etching the second dielectric material layer 210 until the top surface of the interconnect stop layer 209 is exposed to form the initial through hole using the second mask layer as an etching mask.

The second dielectric layer 211 may be made of silicon oxide. The third initial opening 212 may be used to subsequently form a third opening.

The size of the initial through hole along the direction parallel to the surface of the semiconductor substrate 200 may be in a range of approximately 10 nm-40 nm. The initial through hole may be used to subsequently form a through hole. An interconnect structure may be subsequently formed in the through hole; and the interconnect structure may be electrically connected with the first interconnect member 207. If the size of the initial through hole along the direction parallel to the surface of the semiconductor substrate 200 is smaller than 10 nm, it may be difficult to subsequently remove the interconnect stop layer 209 on the bottom of the initial through hole. The interconnect stop layer 209 on the bottom of the initial through hole may be difficult to be etched through; and the interconnect structure subsequently formed in the through hole may be difficult to be electrically connected with the first interconnect member 207. If the size of the initial through hole along the direction parallel to the surface of the semiconductor substrate 200 is greater than 40 nm, the second dielectric material layer 210 on the top surface of the second interconnect member 272 may also be removed. Accordingly, the interconnect structure subsequently formed in the through hole may be electrically connected with both the first interconnect member 207 and the second interconnect member 272; and it may not facilitate to improve the performance of the semiconductor device.

Returning to FIG. 10, after forming the second dielectric layer with the third initial opening, a third opening may be formed (S107). FIG. 8 illustrates a corresponding semiconductor structure.

As shown in FIG. 8, a third opening 213 is formed. The third opening 213 may be formed by removing the portion of the interconnect stop layer 209 on the bottom of the third initial opening 212.

The process for removing the portion of the interconnect stop layer 209 on the bottom of the third initial opening 212 may be a dry etching process, a wet etching process, or a combination of a dry etching process and a wet etching process, etc.

The size of the initial through hole along the direction parallel to the surface of the semiconductor substrate 200 may be substantially large, it may be relatively easy to remove the portion of the interconnect stop layer 209 under the third initial opening 212. The bottom of the formed third opening 213 may expose the surface of the first interconnect member 207. Thus, the interconnect structure subsequently formed in the third opening 213 may be electrically connected to the first interconnect member 207.

The third opening 213 may host the subsequently formed interconnect structure. In particular, the interconnect structure may be subsequently formed in the third opening 213.

Returning to FIG. 10, after forming the third opening, an interconnect structure may be formed (S108). FIG. 9 illustrates a corresponding semiconductor structure.

As shown in FIG. 9, an interconnect structure 214 is formed in the third opening 213 (referring to FIG. 8).

The process for forming the interconnect structure 214 may include forming an interconnect material layer in the third opening 213 and on the surface of the second dielectric layer 211; and planarizing the interconnect material layer until the top surface of the second dielectric layer 211 is exposed. Thus, the interconnect structure 214 may be formed in the third opening 213.

The interconnect material layer may be made of a metal material. In one embodiment, the interconnect material layer is made of Cu. Correspondingly, the interconnect structure 214 may be made of Cu. In some embodiments, the interconnect material layer may be made of Al. Correspondingly, the interconnect structure may be made of Al.

The interconnect structure 214 may be electrically connected with the first interconnect number 207. At the same time, the distance between the interconnect structure 214 and the second interconnect member 272 may not only include the distance between the distance between the interconnect structure 214 and the second interconnect member 272 along the direction parallel to the surface of the semiconductor substrate 200, but also include the distance between the first dielectric layer 204 and the top of the second interconnect member 272. In particular, the distance between the interconnect structure 214 and the second interconnect member 272 may be sufficiently large; and the portion of the first dielectric layer 204 between the interconnect structure 214 and the second interconnect member 272 may not be easy to break-down. Thus, it may not easy to have a leakage current between the interconnect structure 214 and the second interconnect member 272; and the performance of the semiconductor device may be improved.

The present disclosure also provides a semiconductor structure. FIG. 9 illustrates a corresponding semiconductor structure.

As shown in FIG. 9, the semiconductor structure may include a semiconductor substrate 200 and a first dielectric layer 204 formed on the semiconductor substrate 200. The first dielectric layer 204 may have a first region I and second regions II at both sides of the first region I. The semiconductor structure may include a first interconnect member 207 in the first region I of the first dielectric layer 204; and a second interconnect member 272 in each of the second regions II of the first dielectric layer 204. The top surfaces of the first interconnect member 207 and the second interconnect members 207 may be lower than the top surface of the first dielectric layer 204. The first interconnect member 207 may be formed in the first opening 205 in the first region I of the first dielectric layer 204 (referring to FIG. 3) and the second interconnect members 272 may be formed in the second regions II of the first dielectric layer 204. Further, the semiconductor structure may include a second dielectric layer 211 formed on the surfaces of the first interconnect member 207, the second interconnect members 272 and the first dielectric layer 204; and an interconnect structure 214 formed in the second dielectric layer 211. The interconnect structure 214 may be formed in a third opening 213 (referring to FIG. 8) in the second dielectric layer 211. The bottom of the third opening 213 may expose the top surface of the first interconnect member 207; and the interconnect structure 214 may be electrically connected to the first interconnect member 207. The detailed structures and intermediate structures are described above with respect to the fabrication processes.

The distance between the top surface of the second interconnect member 272 and the top surface of the first dielectric layer 204 may be in a range of approximately 10 nm-50 nm.

The third opening 213 may include a trench and a through hole under the bottom of the trench. The bottom of the through hole may expose the top surface of the first interconnect member 206.

The size of the through hole along the direction parallel to the surface of the semiconductor substrate 200 may be in a range of approximately 10 nm-40 nm. The size of the first interconnect member 207 along the direction of the sidewall surface of the first interconnect member may be smaller than 32 nm. The distance between the first interconnect member 207 and the second interconnect member 272 may be smaller than 32 nm.

In the disclosed method for fabricating a semiconductor structure, the interconnect structure may be used to electrically connect first interconnect members. At the same time, the top surfaces of the second interconnect members may be lower the top surface of the first dielectric layer. Thus, the distance between the interconnect structure and the second interconnect member may not only include the distance between the interconnect structure and the second interconnect member along the direction parallel to the surface of the semiconductor substrate, but also include the distance between the first dielectric layer and the top surface of the second interconnect member. Accordingly, the distance between the interconnect structure and the second interconnect member may be sufficiently large. Thus, the breakdown of the portion of the first dielectric layer between the interconnect structure and the second interconnect member may be prevented. Accordingly, the leakage current issue between the interconnect structure and the second interconnect member may be prevented; and the performance of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a semiconductor substrate;
   forming a first dielectric layer on the semiconductor substrate, the first dielectric layer having a first region and second regions each at a side of the first region;
   forming a first opening in the first region of the first dielectric layer and a second opening in each of the second regions of the first dielectric layer;
   forming a first interconnect member in the first opening;
   forming a second interconnect member with a top surface lower than a top surface of the first dielectric layer in each of the second openings;
   forming a second dielectric layer having a third opening with a bottom exposing a top surface of the first interconnect member on surfaces of the first interconnect member, second interconnect members and the first dielectric layer; and
   forming an interconnect structure in the third opening.

2. The method according to claim 1, wherein the top surface of the first interconnect member is lower than the top surface of the first dielectric layer, wherein forming the first interconnect member and forming the second interconnect member comprise:
   forming a first interconnect material layer in the first opening and the second openings and on a top surface of the first dielectric layer;
   planarizing the first interconnect material layer until the top surface of the first dielectric layer is exposed to form an initial first interconnect member in the first opening and an initial second interconnect member in each of the second openings;
   etching-back a portion of the initial first interconnect member to cause a top surface of the initial first interconnect member is lower than the top surface of the first dielectric layer to form a first interconnect member; and
   etching-back portions of the initial second interconnect members to cause top surfaces of the initial second interconnect members to be lower than the top surface of the first dielectric layer to form the second interconnect members.

3. The method according to claim 2, wherein:
   the first interconnect material layer is planarized by a chemical mechanical polishing process.

4. The method according to claim 2, wherein:
   the first interconnect material layer is made of one of Cu and Al.

5. The method according to claim 1, wherein:
   a distance between the top surface of the second interconnect member and the top surface of the first dielectric layer along a direction perpendicular to the top surface of the second interconnect number is in a range of approximately 10 nm-50 nm.

6. The method according to claim 1, after forming the first interconnect member and the second interconnect members and before forming the second dielectric layer, further comprising:

forming an interconnect stop layer on the second dielectric layer, the first interconnect number and the second interconnect members.

7. The method according to claim 6, wherein the through hole is formed after forming the trench, wherein forming the through hole and the trench comprises:
forming a first mask layer exposing a portion of a top surface of the second dielectric layer on the top surface of the second dielectric material layer;
etching the portion of the second dielectric material layer to form the trench using the first mask layer as an etching mask;
forming a second mask layer on the surface of the second dielectric material layer and a portion of a bottom surface of the trench;
etching the second dielectric layer using the second mask layer as an etching mask until the interconnect stop layer is exposed to form an initial through hole in the second dielectric layer; and
removing a portion of the interconnect stop layer exposed by the initial through hole to form the through hole.

8. The method according to claim 6, wherein:
a size of the through-hole along a direction parallel to the surface of the semiconductor substrate is in a range of approximately 10 nm-40 nm.

9. The method according to claim 1, wherein forming the third opening comprises:
forming a second dielectric material layer on the surfaces of the first interconnect member, the second interconnect members and on the top surface of the first interconnect layer; and
removing a portion of the second dielectric material layer until the top surface of the first interconnect member is exposed,
wherein the third opening includes a trench and a through hole under a bottom of the trench; and the through hole exposes the top surface of the first interconnect member.

10. The method according to claim 1, wherein:
a size of the first interconnect member along a sidewall surface direction of the first interconnect member is smaller than 32 nm.

11. The method according to claim 1, wherein:
a distance between the first interconnect member and the second interconnect along a direction parallel to the surface of the semiconductor substrate member is smaller than 32 nm.

12. A semiconductor structure, comprising:
a semiconductor substrate;
a first dielectric layer on the semiconductor substrate, the first dielectric layer having a first region and second regions each at a side of the first region;
a first interconnect member formed in the first region of the first dielectric layer and a second interconnect member formed in each of the second regions of the first dielectric layers, wherein a top surface of the second interconnect member is lower than a top surface of the first dielectric layer;
a second dielectric layer formed on the first interconnect member, the second interconnect member and the top surface of the first dielectric layer; and
an interconnect structure electrically connected to the first interconnect member and formed in the second dielectric layer.

13. The semiconductor structure according to claim 12, wherein:
a distance between the top surface of the second interconnect member and the top surface of the first dielectric layer along a direction perpendicular to the top surface of the second interconnect member is in a range of approximately 10 nm-50 nm.

14. The semiconductor structure according to claim 12, wherein:
the interconnect structure is formed in a trench and a through hole in the second dielectric layer;
the through hole is connected to the trench and under the trench; and
a bottom of the through hole exposes a top surface of the first interconnect member.

15. The semiconductor structure according to claim 14, wherein:
a size of the through hole along a direction parallel to a surface of the semiconductor substrate is in a range of approximately 10 nm-40 nm.

16. The semiconductor structure according to claim 12, wherein
a size of the first interconnect member along a sidewall surface direction of the first interconnect member is smaller than 32 nm.

17. The semiconductor structure according to claim 12, wherein:
a distance between the first interconnect member and the second interconnect member along a direction parallel to the surface of the semiconductor substrate is smaller than 32 nm.

18. The semiconductor structure according to claim 12, wherein:
the first dielectric layer is made of low-K dielectric material; and
the second dielectric layer is made of silicon oxide.

19. The semiconductor structure according to claim 12, wherein:
the first interconnect member and the second interconnect members are made of one of Cu and Al.

20. The semiconductor structure according to claim 12, further comprising:
a first stop layer between the first dielectric layer and the semiconductor substrate; and
an interconnect stop layer between the first dielectric layer and the second interconnect layer.

* * * * *